(12) United States Patent
Liu et al.

(10) Patent No.: US 7,399,651 B2
(45) Date of Patent: Jul. 15, 2008

(54) LED PACKAGE STRUCTURE AND MASS PRODUCTION METHOD OF MAKING THE SAME

(75) Inventors: Chia-Chi Liu, Taipei (TW); Pao-Chi Chi, Pa Te (TW)

(73) Assignee: Lustrous Technology Ltd., Taipei (TW)

( * ) Notice: Subject to any disclaimer, the term of this patent is extended or adjusted under 35 U.S.C. 154(b) by 123 days.

(21) Appl. No.: 11/315,378

(22) Filed: Dec. 23, 2005

(65) Prior Publication Data

US 2006/0166388 A1 Jul. 27, 2006

(30) Foreign Application Priority Data

Jan. 25, 2005 (TW) .............................. 94102184 A

(51) Int. Cl.
*H01L 21/00* (2006.01)
(52) U.S. Cl. .............................. 438/24; 438/22; 257/81; 257/99
(58) Field of Classification Search .................. 438/22, 438/24, 51, 55; 257/81, 99
See application file for complete search history.

(56) References Cited

U.S. PATENT DOCUMENTS

| 7,098,483 | B2 * | 8/2006 | Mazzochette et al. | ......... 257/81 |
| 2006/0138436 | A1 * | 6/2006 | Chen et al. | ................... 257/98 |

* cited by examiner

*Primary Examiner*—Theresa T Doan
(74) *Attorney, Agent, or Firm*—Troxell Law Office, PLLC

(57) ABSTRACT

An LED package structure includes a lower substrate, an upper substrate disposed on the lower substrate and having a though hole exposing a portion of the upper surface of the lower substrate; an individual LED unit disposed within the through hole in the upper substrate, a conductive pattern layer disposed on the upper substrate, a conducting wire interconnecting electrically the LED unit and the conductive pattern layer, and an encapsulating body disposed on the conductive pattern layer in such a manner that the encapsulating body hermetically encloses the LED unit, the through hole in the upper substrate and an inner peripheral portion of the conductive pattern layer surrounding the through hole. The lower and upper substrates are separately formed.

5 Claims, 2 Drawing Sheets

LED PACKAGE STRUCTURE AND MASS PRODUCTION METHOD OF MAKING THE SAME

FIELD OF THE INVENTION

The present invention relates to a light emitting diode (LED), more particularly to an LED package structure and the method of fabricating the LED package structure.

BACKGROUND OF THE INVENTION

Employment of an LED within an electronic device or industry is prevalent day by day. Every electronic device is targeted to produce in compact size. Since the power cost for generating light by the LED is much lower than that of the conventional fluorescent lamps and due to its compact size, the utility of LED within the electronic devices can cause the latter objects to be produced in the compact size too.

Referring to FIG. 1, a fragmentary sectional view of the conventional LED package structure 10 is shown to include a support member 14 disposed on a dielectric member 11, an LED unit 12 disposed within a recess 15 formed in the support member 14, an addressing pattern layer 16 disposed around the recess 15, connecting wires 18a, 18b electrically interconnecting the LED 12 and the pattern layer 16, and an encapsulating body 20 enclosing hermetically the LED 12, the recess 15 in the support member 14 and the inner peripheral portion of the addressing pattern layer 16 except two electrodes 22a, 22b for connection purposes.

Note that the recess 15 in the support member should have sufficient depth in order to receive an individual LED therein. The depth of the recess 15 and the planar elevation of the bottom of the recess 15 are important factors in determining the reliability of LED package structure. Uneven of the bottom surface of the recess 15 in the support member 14 can greatly affect the light emitting stability of the conventional LED package structure.

Since the conventional LED package structure is mass-produced by using an automatic process, it is somewhat difficult to maintain the uniform depth of the recess 15 in the support member 14. Even depth of the recess 15 and evenness of the bottom surface in the recess 15 are two main factors that can greatly affect the light emitting reliability of the conventional LED package structure.

For each of the LED 12, unevenness at the bottom surface of the LED 12 may lead to unstable balance on the support member 14. Moreover, unevenness at the bottom surface in the recess 15 and the LED 12 can result in displacement of the bonding wires 18a, 18b with respect to the LED unit 12, thereby greatly affecting the light emitting reliability of the conventional LED package structure.

Presently, there is urgently in need of a method to remedy the aforesaid two main factors that affect the light emitting reliability of the conventional LED package structure. The support member 14 itself has a relatively small thickness, automatically boring a precise depth in each of the recesses 15 is troublesome. Therefore, it is the main object of the present invention is to find a way improve the light emitting reliability of the conventional LED package structure.

SUMMARY OF THE INVENTION

The object of the present invention is to provide an LED package structure which has unique construction to overcome the difficulties encountered during mass production of the conventional LED package structure.

In one aspect of the present invention, a method of fabricating an LED package structure is provided. The LED package structure includes a plurality of individual LED units. The method includes the steps of: (i) providing a plurality of lower substrates, each of the lower substrates having a predetermined thickness; (ii) providing a plurality of upper substrates, each of the upper substrates having upper and bottom surfaces and a through hole extending through the upper and bottom surfaces thereof; (iii) disposing a respective one of the upper substrates onto a respective one of the lower substrates in such a manner to form a base member that has a recess defined by the through hole in the respective one of the upper substrates; and (iv) disposing each of the LED units into the recess in the base member.

In another aspect of the present invention, an LED package structure is provided to include: a lower substrate having an upper surface; an upper substrate disposed on the lower substrate, and having a though hole exposing a portion of the upper surface of the lower substrate; an individual LED unit disposed within the through hole in the upper substrate; a conductive pattern layer disposed on the upper substrate; a conducting wire interconnecting electrically the LED unit and the conductive pattern layer; and an encapsulating body disposed on the conductive pattern layer in such a manner that the encapsulating body hermetically encloses the LED unit, the through hole in the upper substrate and an inner peripheral portion of the conductive pattern layer surrounding the through hole.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 2A:
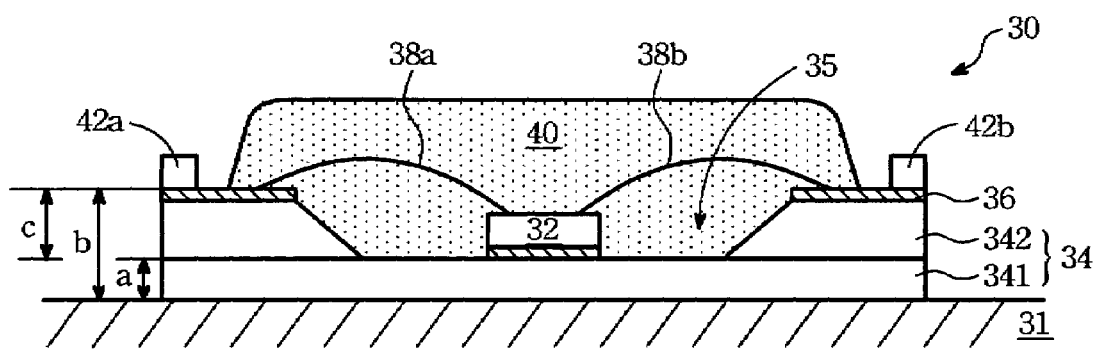
FIG. 2A is a fragmentary sectional view of the first embodiment of an LED package structure according to the present invention.

Referring to FIG. 2A, a fragmentary sectional view of the first embodiment of an LED package structure 30 according to the present invention is shown to include a base member 34, a plurality of individual LED units 32 (only one is shown in FIG. 2A), a conductive pattern layer 36, two conducting wires 38a, 38b, an encapsulating body 40, and two electrodes 42a, 42b.

As illustrated, the base member 34 is disposed on a dielectric member 31, and includes a lower substrate 341 of a predetermined thickness "a" and an upper substrate 342 that is disposed on an upper surface of the lower substrate 341 and that has upper and bottom surfaces and a through hole 35, extending through the upper and bottom surfaces thereof such that once assembled, a portion of the upper surface of the lower substrate 341 is exposed to the external atmosphere. The through hole 35 in the upper substrate 342 converges gradually toward the lower substrate 341. Each individual LED unit 32 is disposed within the recess defined by the through hole 35 in the base member 34. The conductive pattern layer 36 is disposed on the upper substrate 342 surrounding the recess in the base member 34. The assembly of the base member 34 and the pattern layer 36 has a height "b". The conducting wires 38a, 38b interconnect the pattern layer 36 to the LED unit 32. The encapsulating body 40 is disposed on the pattern layer 36 in such a manner that the encapsulating body 40 encloses hermetically the LED unit 32, the recess in the base member 34, and an inner peripheral portion of the pattern layer 36 surrounding the recess. The encapsulating body 40 generally has a dome shape, is preferably made from epoxy resin or silver resinous material. Under this condition, only the electrodes 42a, 42b are exposed to the external atmosphere for connecting purposes (generally electronic device). Since the construction of the LED unit 32, forming of the pattern layer 36 on the upper substrate 342, and formation of the encapsulating body 40 is not the relevant feature of the present invention, a detailed disclosure thereof is omitted herein for the sake of brevity.

Figure 1:
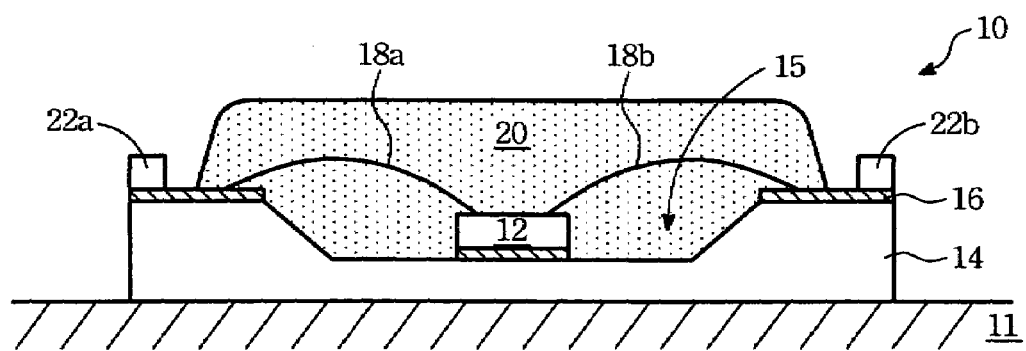
FIG. 1 is a fragmentary sectional view of a conventional LED package structure.

In the conventional LED package structure (see FIG. 1), it is relatively difficult to form the recess 15 in the base member 14 that must have a flat bottom wall and a peripheral wall diverging gradually from the bottom wall. Forming of the adjoining edge that interconnects the peripheral wall and the bottom wall in the recess 15 in the support member 14 is not easy to achieve by conventional machine tool. High precision machine tools and complicated processes will be required to form the recess 15 in the base member 14. Employment of high precision machine tools can result in extra manufacture cost.

In contrast to the conventional art, in the present invention, boring of the tapered through hole 35 in the upper substrate 342, forming flat upper surface on the lower substrate 341, and coupling the upper and lower substrates 341, 342 so as to form the base member 34 can be conducted with ease without employment of high precision machine tools. Note that the flat upper surface of the lower substrate 341 defines a bottom wall of the recess while the peripheral wall defining the through hole 35 in the upper substrate 342 extends divergently from the bottom wall. Unlike to the conventional LED package structure, the LED package structure of the present invention can be made by conventional machine tools, thereby eliminating the difficulties encountered during mass production of the conventional LED package structure.

In the first embodiment of the present invention, the upper and lower substrates 341, 342 can be made from high conductive materials, such as aluminum, copper and ceramic substance. Preferably, the lower substrate 341 is constructed from a heat-conducting pipe that is flattened in such a manner to have flat upper and lower pipe sections. The upper and lower substrates 341, 342 are separately produced and are later coupled together to form the base member 34. Since the thickness of the pattern layer 36 is considerably small, the thickness "c" of the upper substrate 342 is generally equivalent to that of the lower substrate 341.

Figure 2B:
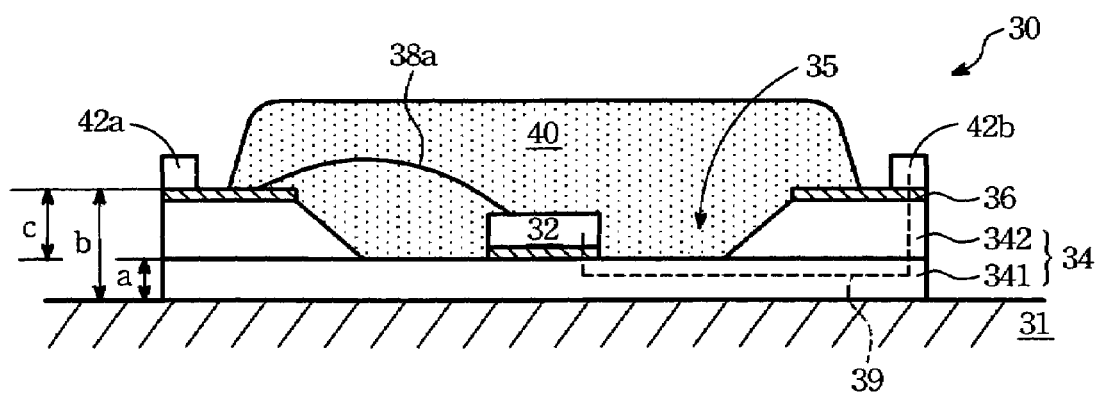
FIG. 2B is a fragmentary sectional view of the second embodiment of an LED package structure according to the present invention.

Referring to FIG. 2B, the second embodiment of the LED package structure according to the present invention is shown to have a construction similar to that of the first embodiment. The only difference resides in that the encapsulating body 40 does not enclose the right conducting wire 39, the latter is rather disposed in the pipe-like lower substrate 341 and is connected to the electrode 42b.

Figure 3:
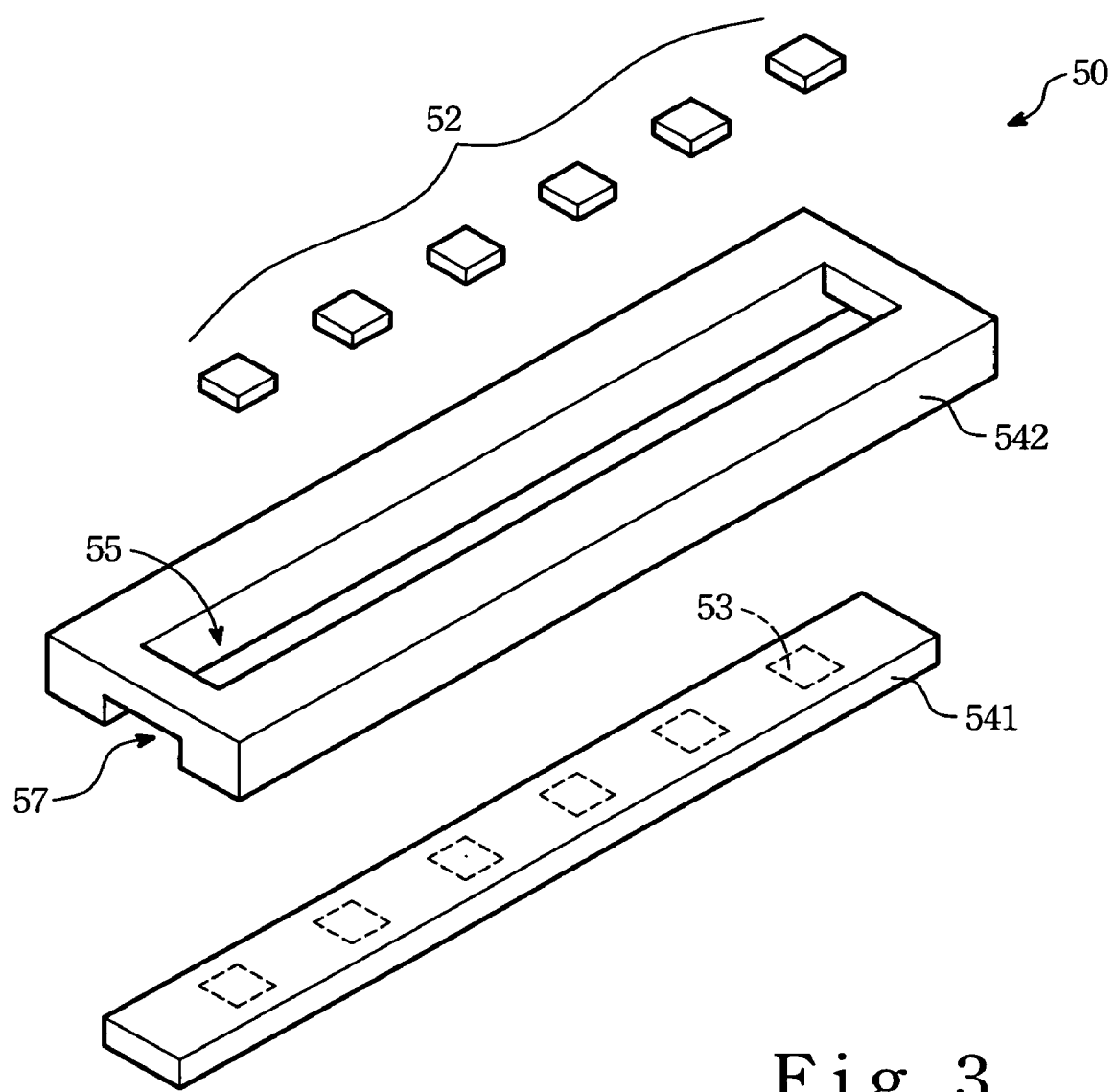
FIG. 3 is an exploded view of the LED package structure of the present invention.

FIG. 3 shows an exploded view of the LED package structure 50 fabricated according to the method of the present invention. The LED package structure 50 includes a lower substrate 541, an upper substrate 542, and a plurality of individual LED units 52. The lower substrate 541 is made from a heat dissipating material, and has an upper flat surface defining a plurality of receiving regions 53. The upper substrate 542 is disposed on the lower substrate 541, is made from aluminum, and has a through hole 55 and a hollow channel 57 at the bottom to receive the lower substrate 541 therein such that the upper flat surface of the lower substrate 541 serves as the bottom of a recess for receiving the LED units 52 at the regions 53. Evenness of the upper flat surface of the lower substrate 542 provides stable position of the respective LED unit 52 at the respect region 53.

Referring again to FIG. 2A, the fabricating method includes the steps (i) providing a plurality of lower substrates 341 (only one is shown in FIG. 2A), each of the lower substrates 341 having a predetermined thickness; (ii) providing a plurality of upper substrates 342 (only one is shown in FIG. 2A), each of the upper substrates 342 having upper and bottom surfaces and a through hole 35 extending through the upper and bottom surfaces thereof; (iii) disposing a respective one of the upper substrates 342 onto a respective one of the lower substrates 341 in such a manner to form a base member 34 having a recess defined by the through hole 35 in the respective one of the upper substrates 342; and (iv) disposing each of the LED units 32 into the recess in the base member 34.

Referring again to FIG. 2A, the fabricating method further includes the steps (v) a wire bonding operation in order to form at least one conducting wire 38a(38b) that interconnects each of the LED units 32 and a conductive pattern 36 disposed on the upper substrate 342 of the base member 34 and (vi) conducting packing operation to provide an encapsulating body 40 onto the base member 34 in such a manner that the encapsulating body 40 encloses the respective LED unit 32, an entire portion of the recess and an inner peripheral portion of the conductive pattern 36 around the recess (see FIG. 2A). The upper substrate 342 has a thickness generally equivalent to the predetermined thickness of the lower substrate 341. Referring again to FIG. 3, in order to facilitate heat-conducting purpose, each upper substrate 542 is formed with a bottom channel 57 that fluidly communicates the through hole 55 in the upper substrate 542. The lower substrate 541 can be in the form of a heat conducting plate that is flatten to have a flat upper surface defining a plurality of LED-positioning regions 53. The lower substrate 541 can be fitted into the bottom channel 57 in the upper substrate 542 to provide stability of the LED package structure.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A method of fabricating an LED assembly that includes a plurality of individual LED units, comprising the steps of:

(i) providing a plurality of lower substrates, each of said lower substrates being a heat conducting pipe having a predetermined thickness and being flattened in such a manner to have flat upper and lower pipe sections;

(ii) providing a plurality of upper substrates, each of said upper substrates having upper and bottom surfaces and a through hole extending through said upper and bottom surfaces thereof;

(iii) disposing a respective one of said upper substrates onto a respective one of said lower substrates in such a manner to form a base member having a recess defined by said through hole in the respective one of said upper substrates; and (iv) disposing each of the LED units into said recess in said base member.

2. The method according to claim 1, further comprising a step (v) a wire bonding operation in order to form at least one conducting wire that interconnects each of the LED units and a conductive pattern disposed on said upper substrate of said base member.

3. The method according to claim 1, further comprising a step (vi) conducting packing operation to provide an encapsulating body onto said base member in such a manner that said encapsulating body encloses the respective LED unit, an entire portion of said recess and an inner peripheral portion of said conductive pattern around said recess.

4. The method according to claim 1, wherein each of said upper substrates has a thickness generally equivalent to said predetermined thickness of a respective one of said lower substrates.

5. The method according to claim 4, wherein said encapsulating body is made from epoxy or silver resinous material.

* * * * *